(12) United States Patent
Son et al.

(10) Patent No.: US 11,886,049 B2
(45) Date of Patent: Jan. 30, 2024

(54) OPTICAL PATH CONTROL MEMBER AND DISPLAY DEVICE COMPRISING SAME

(71) Applicant: LG INNOTEK CO., LTD., Seoul (KR)

(72) Inventors: Mun Yeong Son, Seoul (KR); Jin Mi Noh, Seoul (KR); Hyeon Ji Hong, Seoul (KR); Byung Sook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/041,165

(22) PCT Filed: Aug. 6, 2021

(86) PCT No.: PCT/KR2021/010399
§ 371 (c)(1),
(2) Date: Feb. 9, 2023

(87) PCT Pub. No.: WO2022/045627
PCT Pub. Date: Mar. 3, 2022

(65) Prior Publication Data
US 2023/0266625 A1    Aug. 24, 2023

(30) Foreign Application Priority Data

Aug. 25, 2020 (KR) .......... 10-2020-0106989
Aug. 27, 2020 (KR) .......... 10-2020-0108370

(51) Int. Cl.
*G02F 1/13357* (2006.01)
*C08F 220/34* (2006.01)
(Continued)

(52) U.S. Cl.
CPC .... *G02F 1/133617* (2013.01); *C08F 220/343* (2020.02); *G02F 1/137* (2013.01); *G02F 1/1323* (2013.01); *G02F 1/13338* (2013.01)

(58) Field of Classification Search
CPC ...... G02F 1/1675; G02F 1/1335; G02F 1/137; G02F 1/167; G02F 1/1323;
(Continued)

(56) References Cited

U.S. PATENT DOCUMENTS

2003/0222842 A1*  12/2003  Yuasa .............. G02F 1/167
                                                    345/107
2011/0175939 A1     7/2011  Moriyama et al.
(Continued)

FOREIGN PATENT DOCUMENTS

JP   2002062545 A  *  2/2002 ............ G02F 1/167
JP   2010282916 A  *  12/2010
(Continued)

OTHER PUBLICATIONS

International Search Report dated Nov. 11, 2021 in International Application No. PCT/KR2021/010399.

*Primary Examiner* — Hoan C Nguyen
(74) *Attorney, Agent, or Firm* — Saliwanchik, Lloyd & Eisenschenk

(57) ABSTRACT

An optical path control member according to an embodiment comprises: a first substrate; a first electrode disposed on the first substrate; a second substrate disposed on the first substrate; a second electrode disposed below the second substrate; and a light conversion unit disposed between the first electrode and the second electrode, wherein: the light conversion unit includes a partition wall portion, an accommodation portion, and a base portion; a light converting material including a dispersion liquid, light converting particles, and a dispersing agent is arranged in the accommodation portion; and the dispersing agent includes a nonionic dispersing agent.

19 Claims, 11 Drawing Sheets

(51) Int. Cl.
*G02F 1/13* (2006.01)
*G02F 1/137* (2006.01)
*G02F 1/1333* (2006.01)

(58) Field of Classification Search
CPC ........... G02F 1/133617; G02F 1/13338; G02B 26/08; G02B 5/30; C08F 220/343; H10K 59/00; H10K 50/80
See application file for complete search history.

(56) References Cited

U.S. PATENT DOCUMENTS

| | | | |
|---|---|---|---|
| 2013/0175479 A1* | 7/2013 | Du | G02F 1/167 |
| | | | 252/500 |
| 2016/0085132 A1* | 3/2016 | Telfer | G09G 3/2003 |
| | | | 359/296 |
| 2016/0143174 A1 | 5/2016 | Cho | |
| 2017/0369725 A1 | 12/2017 | Mitsuyoshi et al. | |
| 2018/0210312 A1 | 7/2018 | Liu et al. | |
| 2019/0115507 A1* | 4/2019 | Kim | H10K 50/82 |

FOREIGN PATENT DOCUMENTS

| | | | | |
|---|---|---|---|---|
| KR | 2002-0081710 A | | 10/2002 | |
| KR | 10-2004-0072337 A | | 8/2004 | |
| KR | 20120067167 A | * | 6/2012 | |
| KR | 10-2016-0059562 A | | 5/2016 | |
| KR | 10-1766192 B1 | | 8/2017 | |
| KR | 10-2017-0100506 A | | 9/2017 | |
| KR | 10-2020-0028078 A | | 3/2020 | |
| NL | 1020436 C2 | * | 8/2003 | ............. G02F 1/167 |

* cited by examiner

Fig. 13
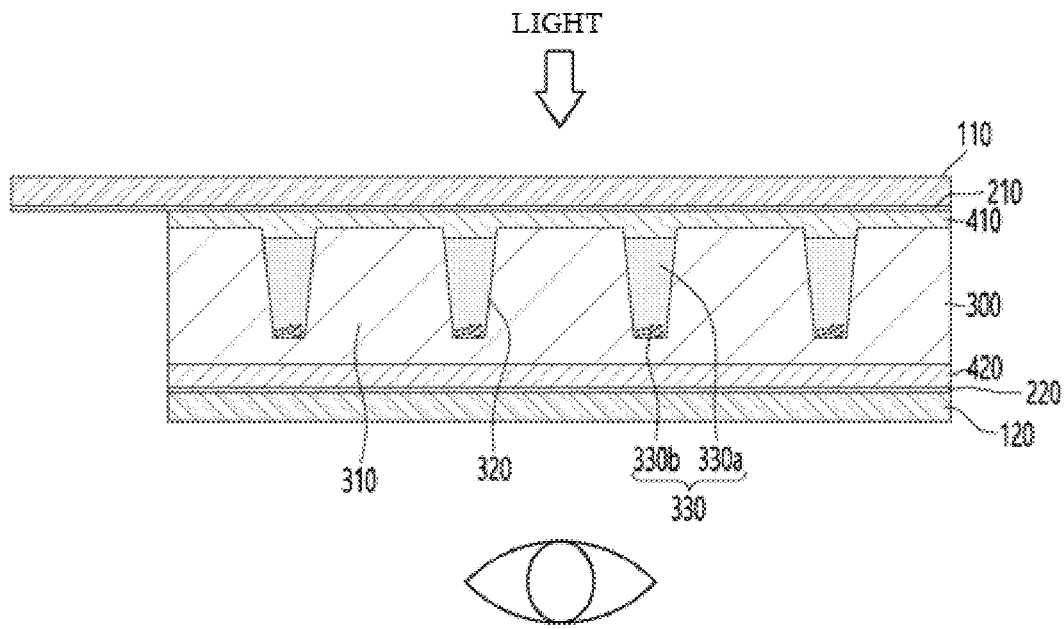
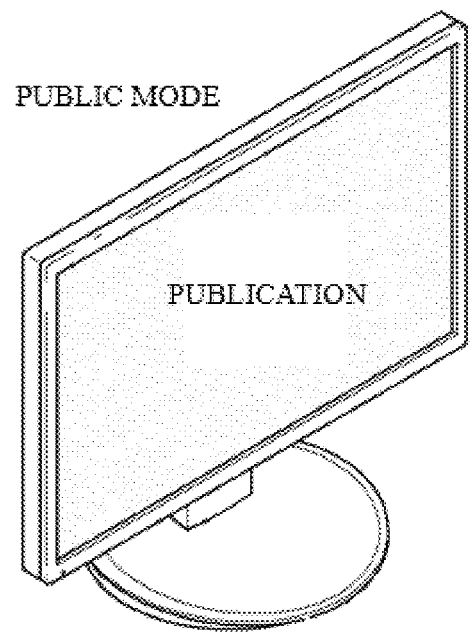

Fig. 14
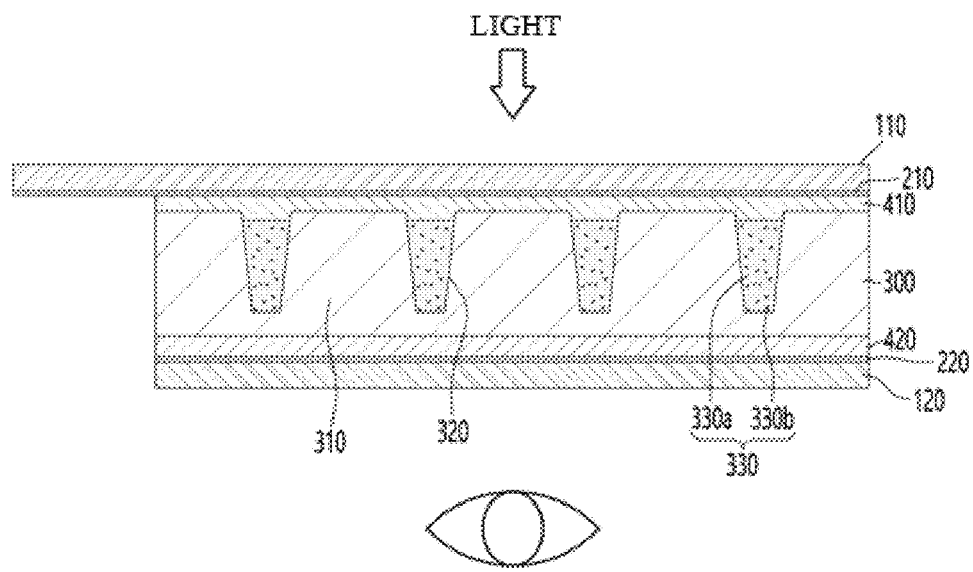
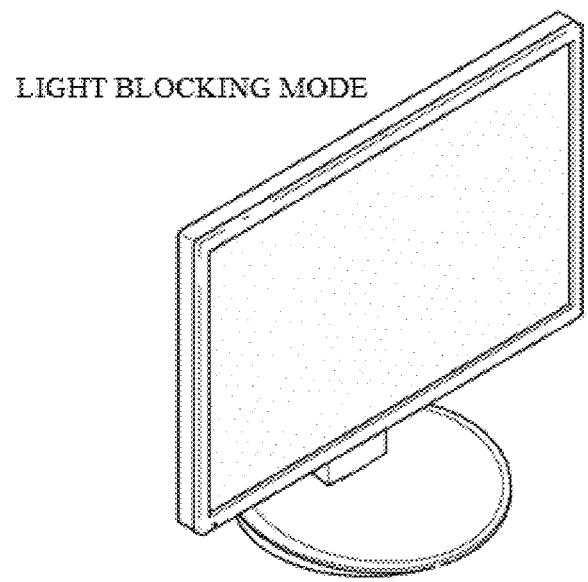
LIGHT BLOCKING MODE

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/010399, filed Aug. 6, 2021, which claims the benefit under 35 U.S.C. § 119 of Korean Application Nos. 10-2020-0106989, filed Aug. 25, 2020; and 10-2020-0108370, filed Aug. 27, 2020; the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern part into a light transmitting part and a light blocking part by filling the inside of the accommodating part with light conversion material including particles that may move when a voltage is applied and a dispersion liquid for dispersing the particles and by dispersing and aggregating the particles.

Meanwhile, a light conversion unit is formed by imprinting a photocurable resin, and thus, a base part, a barrier rib part, and an accommodating part may be formed in the light conversion unit.

A light conversion material may be filled in the accommodating part. In this case, dispersants may be added to the light conversion material to inhibit aggregation of the light conversion particles.

The dispersant may inhibit aggregation of the light conversion particles to increase the lifespan of the optical path control member, but may interfere with the movement of the light conversion particles inside the accommodating part, thereby the driving characteristics of the optical path control member may be reduced.

Accordingly, the optical path control member having a new structure capable of solving the above problems is required.

DISCLOSURE

Technical Problem

An embodiment relates to an optical path control member having improved driving characteristics.

Technical Solution

An optical path control member according to an embodiment includes: a first substrate; a first electrode disposed on the first substrate; a second substrate disposed on the first substrate; a second electrode disposed under the second substrate; and a light conversion unit disposed between the first electrode and the second electrode, wherein the light conversion unit includes a barrier rib part, an accommodating part, and a base part, wherein a light conversion material including a dispersion liquid, light conversion particles, and a dispersant is disposed in the accommodating part, wherein the dispersant includes a nonionic dispersing agent.

Advantageous Effects

The optical path control member according to the embodiment may improve the driving speed and driving characteristics of the optical path control member by improving the moving speed of the light conversion particles.

That is, since the dispersant included in the light conversion material includes a non-polar nonionic dispersant, it is possible to inhibit formation of a bonding layer by bonding the light conversion particles and the dispersant inside the dispersion liquid.

Accordingly, when a voltage is applied to the optical path control member, since the light conversion particles may be moved directly without removing the bonding layer, the driving speed of the optical path control member may be improved.

In addition, driving characteristics of the optical path control member may be improved by improving negative charge characteristics of the barrier rib part and/or the base part.

That is, since the resin composition forming the barrier rib part and/or the base part includes a monomer having a bonding group having a high electronegativity, the barrier rib part and/or the base part may include a plurality of negative charges, and thus a polarity of the barrier rib part and/or the base part may increase.

Accordingly, it is possible to facilitate the movement of the light conversion particles by moving dispersants having positive charges inside the light conversion material in the direction of the barrier rib part and/or the base part. In addition, since the size of the negative charge of the light conversion particle may be inhibited from being reduced due to the bonding of the positively charged dispersant and the light conversion particle, the movement speed of the light conversion particle may be improved.

Accordingly, the optical path control member according to the embodiment may have improved driving speed and driving characteristics.

DESCRIPTION OF DRAWINGS

FIGS. 13 to 15 are views for describing one embodiment of the display device to which the optical path control member according to the embodiment is applied.

MODES OF THE INVENTION

Figure 1:
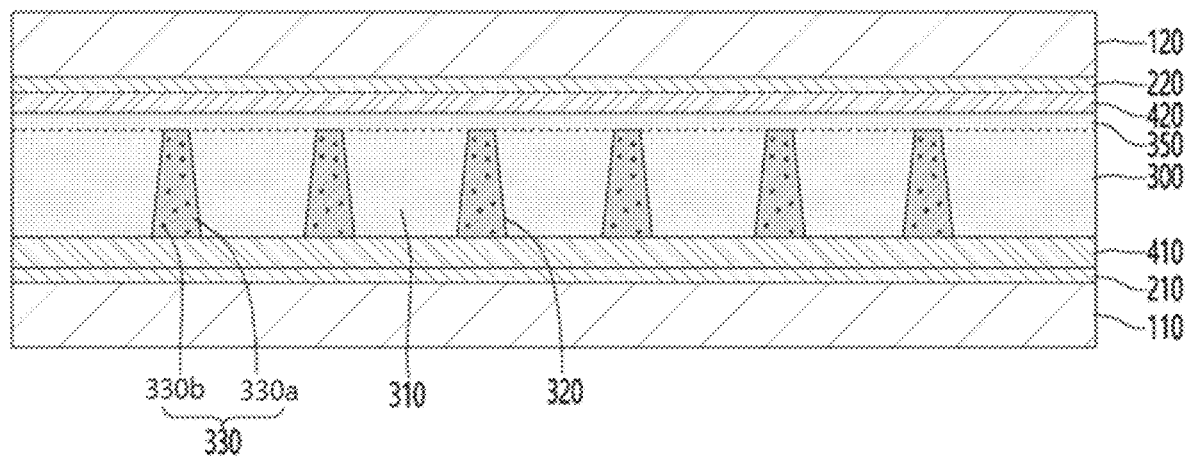
FIGS. 1 to 2 are cross-sectional views of a light conversion unit of a optical path control member according to an embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings.

First, the light conversion unit of the optical path control member according to the embodiment will be described with reference to FIGS. 1 to 5.

Referring to FIGS. 1 to 5, the light conversion unit 300 may be disposed between a first substrate 110 and a second substrate 120. In detail, the light conversion unit 300 may be disposed between a first electrode 210 and a second electrode 220. Alternatively, the light conversion unit 300 may be disposed between an adhesive layer 410 and a buffer layer 420.

The light conversion unit may include a barrier rib part 310, an accommodating part 320 and a base part 350.

A light conversion material 330 may be disposed in the accommodating part 320. In detail, the light conversion material 330 including a dispersion liquid 330a and light conversion particles 330b may be disposed in the accommodating part 320.

The light conversion particles 330b dispersed in the dispersion liquid 330a may receive a voltage from the first electrode 210 and/or the second electrode 220 and move in the direction of the first electrode 210 or the second electrode 220.

The light conversion material 330 may further include a plurality of dispersants 11, 12. The dispersant may be dispersed inside the dispersion liquid 330a. The dispersant 11, 12 may inhibit the light conversion particles 330b from aggregating with each other. Accordingly, the driving characteristics of the optical path control member may be improved by inhibiting the light conversion particles 330b from aggregating inside the dispersion liquid 330a.

The dispersant 11, 12 may be defined as various dispersants depending on whether or not it is polar. In detail, the dispersant 11, 12 may include a cationic dispersant having a positive charge, an anionic dispersant having a negative charge, and a nonionic dispersant having no charge.

Since the light conversion particles 330b disposed inside the dispersion liquid 330a have electric charges, the dispersants 11, 12 disposed inside the dispersion liquid 330a may interfere with the movement of the light conversion particles 330b.

For example, the light conversion particles 330b may have a negative charge. Accordingly, when a positive voltage is applied to the first electrode 210 and/or the second electrode 220, the light conversion particles 330b may move in the direction of the first electrode 210 or the second electrode 220.

Accordingly, the dispersant disposed inside the dispersion liquid 330a may not have the same electric charge as the light conversion particles 330b. That is, when the light conversion particles 330b and the dispersant have electric charges of the same polarity, the dispersant may be moved together by the voltage applied from the first electrode 210 and/or the second electrode 220, and thus the dispersant may interfere with the movement of light conversion particles 330b. Accordingly, the light conversion particles and the dispersant may have charges of different polarities.

For example, when the light conversion particles 330b have a negative charge, the anionic dispersant cannot be used.

Accordingly, the dispersants 11, 12 may be the cationic dispersant or the nonionic dispersant.

Meanwhile, when the dispersant 11, 12 has polarity, the light conversion particles having polarity and the dispersant may be bonded.

For example, when the cationic dispersant having a cation is disposed inside the dispersion liquid 330a, the light conversion particles 330b disposed inside the dispersion liquid 330a and having an anion may be bonded with the dispersant.

Figure 3:
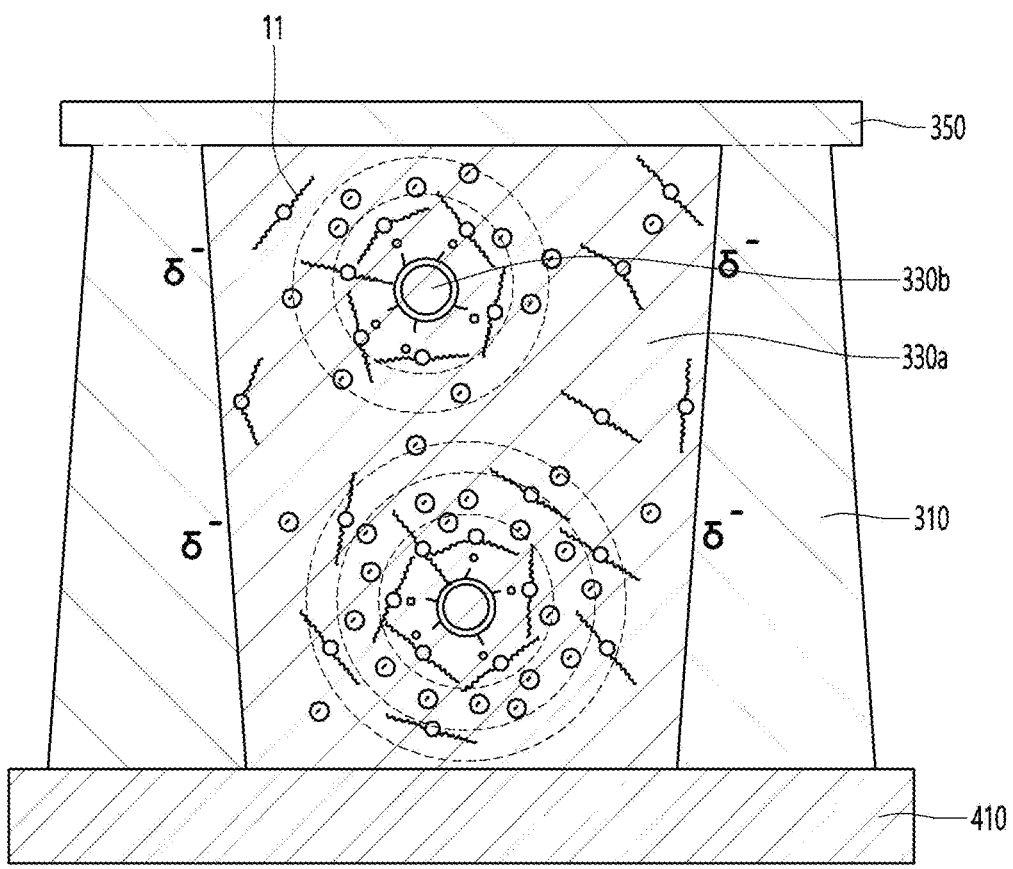
FIGS. 3 to 5 are enlarged views of one region of the light conversion unit of the optical path control member according to the embodiment.
Figure 4:
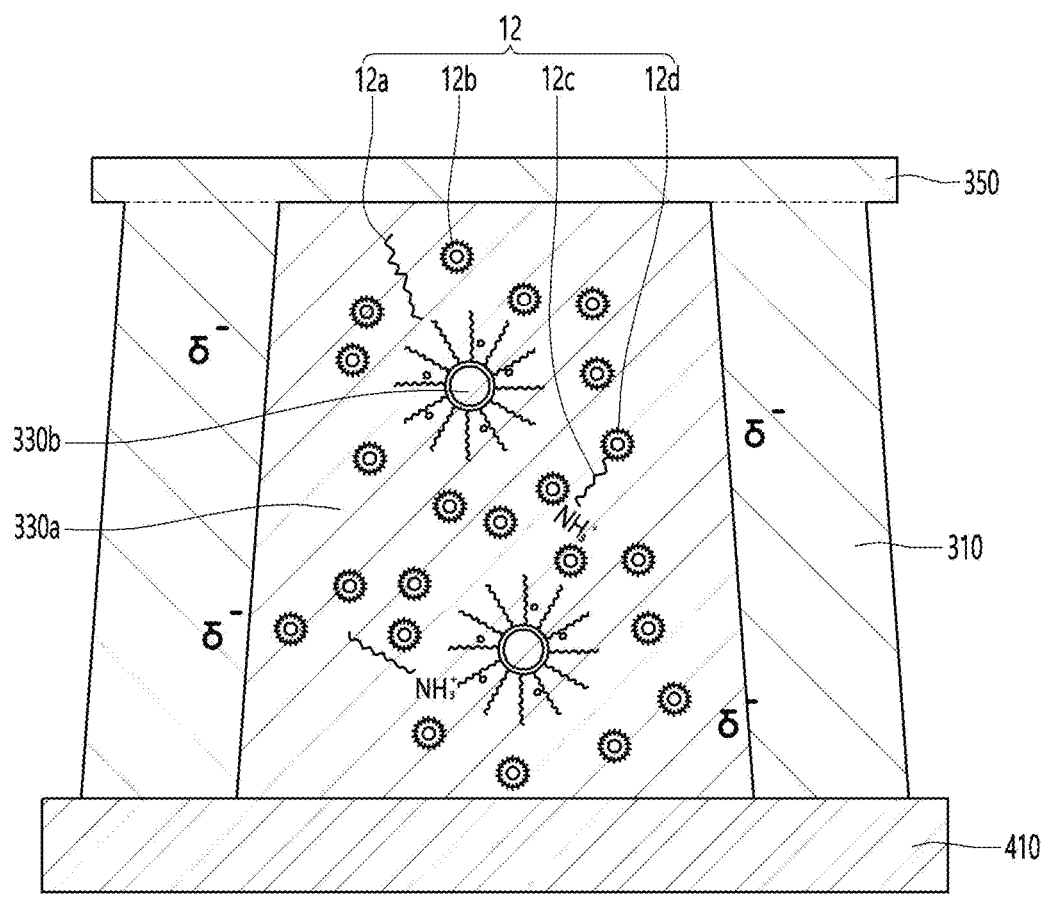

FIGS. 3 and 4 are enlarged views of the inside of the accommodating part when the cationic dispersant and the nonionic dispersant are disposed inside the dispersion liquid 330a, respectively.

Referring to FIG. 3, when the cationic dispersant is disposed inside the dispersion liquid 330a, the cationic dispersant may be bonded with the negatively charged light conversion particles 330b.

That is, some of the cationic dispersants may be bonded with the light conversion particles 330b. Accordingly, the shell shape of the light conversion particles 330b having a core-shell structure by surface treatment to be negatively charged may be changed. That is, the light conversion particles 330b may be bonded with the cationic dispersant to form a bonding layer. Accordingly, the light conversion particles 330b may include a plurality of light conversion particles having different shell shapes.

Meanwhile, when the cationic dispersant is disposed and bonded to the light conversion particles 30b as shown in FIG. 3, when the voltage is applied to the first electrode 210 and the second electrode 220, the light conversion particles 330b do not move immediately, and the light conversion particles 330b may be moved while the bonding layers are removed.

Accordingly, when the voltage is applied to the first electrode 210 and the second electrode 220, the moving speed of the light conversion particles 30b may decrease.

Meanwhile, referring to FIG. 4, when the nonionic dispersant 12 is disposed in the dispersion liquid 330a, the nonionic dispersant may have various polarities and be disposed. That is, the nonionic dispersant 12 may be disposed with a different polarity depending on whether or not the polarity is present. In detail, the nonionic dispersant 12 may include a first dispersant 12a, a second dispersant 12b, a third dispersant 12c, and a fourth dispersant 12d.

The first dispersant 12a may be defined as a non-polar dispersant. That is, the first dispersant 12a may be defined as a non-polar dispersant having no positive or negative charge. That is, the first dispersant 12a may be a dispersant in which the nonionic dispersant is not modified by another material.

The second dispersant 12b may be defined as a non-polar dispersant. In addition, the second dispersant 12b may be defined as a dispersant having a particle shape. That is, the second dispersant 12b may have a micelle shape formed by aggregation of the first dispersants 12a.

The third dispersant 12c may be defined as a polar dispersant. In detail, the third dispersant 12c may be defined as a polar dispersant having a positive or negative charge. For example, the third dispersant 12c may be defined as a dispersant having a polarity opposite to that of the light conversion particles 330b.

For example, the third dispersant 12c may be defined as a polar particle having a positive charge after the first dispersants 12a lose electrons by the light conversion particles 330b.

In addition, the fourth dispersant 12d may be defined as a polar dispersant. In detail, the fourth dispersant 12d may be defined as a polar dispersant having a positive charge or a negative charge. For example, the fourth dispersant 12d may be defined as a dispersant having a polarity opposite to that of the light conversion particles.

For example, the fourth dispersant 12d may be defined as a dispersant with a particle shape formed by bonding the third dispersant in which the first dispersants 12a lose electrons by the light conversion particles 330b and are changed into positively charged polar particles with the second dispersant. That is, the fourth dispersant 12d may have a positively charged micelle shape formed by aggregation of the first dispersants 12a.

The first dispersant 12a, the second dispersant 12b, the third dispersant 12c, and the fourth dispersant 12d may be disposed between the light conversion particles 330b in the dispersion liquid 330a to inhibit aggregation of the light conversion particles 330b.

The nonionic dispersant 12 is not bonded with the light conversion particles 330b inside the dispersion liquid 330a. That is, since the nonionic dispersant 12 does not have an electric charge, it loses electrons by the light conversion particles 330b to have a positive charge and is not bonded with the light conversion particles 330b.

Accordingly, unlike the structure of FIG. 3, when a voltage is applied to the first electrode 210 and the second electrode 220, the light conversion particles 330b may move directly, so that the movement speed of the light conversion particles may be improved.

That is, the light conversion material of the optical path control member according to the embodiment may include a nonionic dispersant.

Accordingly, since aggregation of the light conversion particles is inhibited in the dispersion liquid and movement of the light conversion particles is not interfered with, the lifetime and driving characteristics of the optical path control member may be improved.

Also, the dispersant may have a low HLB (Hydrophile-Lipophile Balance). HLB is a relative value of the hydrophilic-lipophilic equilibrium state, and the closer to 0, the closer to lipophilicity, and the larger the size, the closer to hydrophilicity.

The dispersant may have a small HLB in consideration of the lipophilicity of the dispersion liquid. In detail, the dispersant may have an HLB of 0 to 6. When the HLB of the dispersant exceeds 6, layer separation of the dispersant and the dispersion liquid may occur due to the hydrophilicity of the dispersant.

On the other hand, as described above, in the case of the nonionic dispersant, some of the dispersant inside the dispersion liquid may be changed to a polar dispersant having a positive charge.

Since the polar dispersant has a polarity different from that of the light conversion particles, the driving speed of the light conversion particles may be reduced by reducing negative charge characteristics of the light conversion particles.

Therefore, the above problems can be solved by changing the polarity of the barrier rib part 310 and the base part 350.

The barrier rib part 310 and the base part 350 may include a resin composition including an oligomer, a monomer, a photoinitiator, and an additive. The resin composition includes the oligomer, the monomer, the photoinitiator, and the additive before curing, and the resin composition may be cured by ultraviolet light while forming a network of cross-linking structure by the reaction of the polymer, the monomer, and the photoinitiator.

The resin composition may include a urethane acrylate polymer. For example, the oligomer may include urethane acrylate.

In addition, as the photoinitiator, a known photoinitiator for UV curing may be applied. In addition, the additive may include a material for improving releasability or electrical properties of the resin composition. For example, the additives may include various materials including release additives and antistatic agents.

The monomer may include a plurality of bonding groups. In detail, the monomer may include various bonding groups to impart polarity to the resin composition.

In detail, the monomer may include a first bonding group and a second bonding group. The first bonding group may have greater polarity than the second bonding group. In detail, the electronegativity of the first bonding group may be greater than that of the second bonding group.

The first bonding group may be defined as a bonding group having an electronegativity of 0.3 to 2. The second bonding group may be defined as a bonding group having an electronegativity of 0 to less than 0.3.

The monomer may include a first bonding group. For example, the monomer may include a monomer including at least one bonding group of C—O, C—S, C—N, O—H, N—H, C—Cl, C—Br, C—I, and Si—O—Si.

In addition, the monomer may further include a second bonding group. In detail, the monomer may further include at least one non-polar bonding group of C—C, C=O, and C—H.

The first bonding group may be more than the second bonding group. For example, the monomer may include monomers such as dipentaerythritol pentaacrylate and diphenyl (2,4,6-trimethylbenzoyl) phosphine oxide, but the embodiment is not limited thereto.

Accordingly, the resin composition including the monomer may have polarity. That is, the resin composition may have a negative charge. In detail, a contact angle θ between the resin composition including the monomer and water may be 60° or less. In more detail, a contact angle θ between the resin composition including the monomer and water may be 10° to 60°.

That is, since the resin composition includes a highly polar monomer, the resin composition including the monomer may also have polarity.

Accordingly, at least one of the barrier rib part 310 and the base part 350 of the light conversion unit formed of the resin composition may also have a polarity.

In detail, at least one of the barrier rib part 310 and the base part 350 may have a polarity opposite to that of the third dispersant 12c and the fourth dispersant 12d. That is, at least one of the barrier rib part 310 and the base part 350 may have the same polarity as that of the light conversion particle 330b.

That is, the barrier rib part 310, the base part 350, and the light conversion particles 330b may include negative charges, and the third dispersant 13 and the fourth dispersant 14 may include positive charges.

Accordingly, dispersants having a polarity among the dispersants dispersed in the dispersion liquid 330a in the accommodating part 320 may move in a direction of at least one of the barrier rib part 310 and the base part 350.

Figure 5:
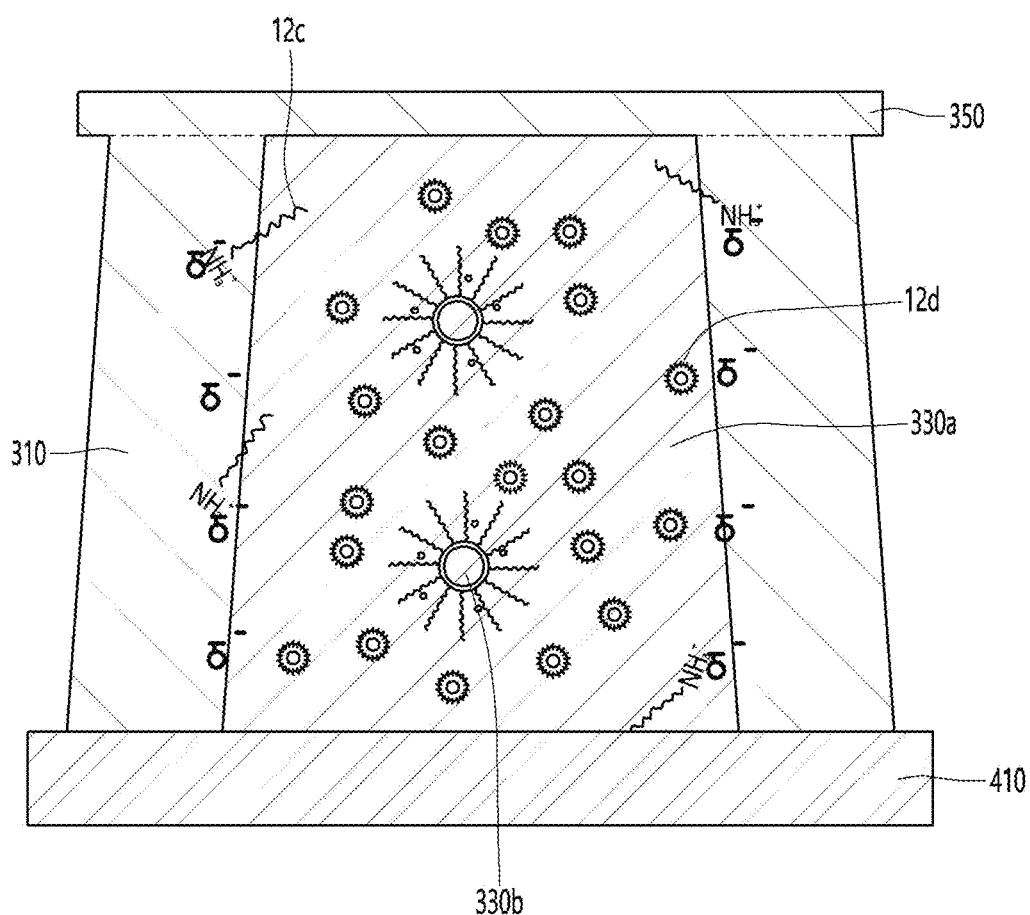

That is, referring to FIG. 5, it can be seen that the barrier rib part 310 and the base part 350 have larger negative charge characteristics than those of FIG. 4.

Accordingly, since the barrier rib part 310 and the base part 350 have electrophilicity, they may be bonded with positive charges, and among the dispersants dispersed in the dispersion liquid 330a, the third dispersant 12c and fourth dispersant 12d having positive charges may move in a direction of at least one of the barrier rib part 310 and the base part 350, and thereby the third dispersant 12c and fourth dispersant 12d may bond with the negative charges of the barrier rib part 310 and the base part 350.

Accordingly, it is possible to inhibit a decrease in polarity of the light conversion particles due to a dispersant having a polarity inside the dispersion liquid 330a, and to inhibit movement interference of the light conversion particles.

Hereinafter, the optical path control member including the above-described light conversion unit will be described in detail.

The barrier rib part 310 may be defined as a barrier rib region dividing the accommodating part. That is, the barrier rib part 310 is a barrier rib region dividing a plurality of accommodating parts and may transmit light. That is, light emitted in the direction of the first substrate 110 or the second substrate 120 may pass through the barrier rib part.

The accommodating part 320 may be formed to partially penetrate the light conversion unit 300. Accordingly, the accommodating part 320 may contact the adhesive layer 410 and be spaced apart from the buffer layer 420. Accordingly, the base part 350 may be formed between the accommodating part 320 and the buffer layer 420.

The base part 350 may be disposed on the barrier rib part 310. In detail, the base part 350 may be disposed in contact with the second electrode 220, and the barrier rib part 310 may be disposed below the base part 350.

A thickness of the base part 350 and a thickness of the barrier rib part 310 may be different from each other. In detail, the thickness of the base part 350 may be smaller than the thickness of the barrier rib part 310.

For example, the thickness of the base part 350 may be 10 μm or less. In detail, the thickness of the base part 350 may be 1 μm to 10 μm. In more detail, the thickness of the base part 350 may be 3 μm to 8 μm. In more detail, the thickness of the base part 350 may be 5 μm to 7 μm.

When the thickness of the base prat 350 exceeds 10 μm, a distance between the second electrode 220 and the accommodating part 320 may increase. That is, the distance between the accommodating part 320 including the light conversion material and the second electrode 220 may increase. Accordingly, the movement characteristics of charges moving through the second electrode 220 to the accommodating part 320 including the light conversion material are reduced by the base part 350 having high resistance, and thus, the driving characteristic of the optical path control member may be reduced.

In addition, since it is difficult to implement in an imprinting process that the thickness of the base part 350 is less than 1 μm, process efficiency may decrease.

The barrier rib part 310 and the accommodating part 320 may be disposed while extending in the second direction 2A of a first substrate 110 and a second substrate 120. That is, the barrier rib part 310 and the accommodating part 320 may extend in the width direction or the length direction of the first substrate 110 and the second substrate 120.

The barrier rib part 310 and the accommodating part 320 may be disposed in different widths. For example, the width of the barrier rib part 310 may be greater than that of the accommodating part 320.

In addition, the accommodating part 320 may be formed in a shape in which a width narrows while extending from a first electrode 210 toward the second electrode 220.

The barrier rib part 310 and the accommodating part 320 may be alternately disposed. In detail, the barrier rib part 310 and the accommodating part 320 may be alternately disposed. That is, each of the barrier rib part 310 may be disposed between the accommodating part s 320 adjacent to each other, and each accommodating part 320 may be disposed between the barrier rib part s 310 adjacent to each other.

Also, the plurality of barrier rib parts 310 may be formed to have a uniform thickness. In detail, the thickness deviation of the plurality of barrier rib parts 310 may be 10% or less. In more detail, the thickness variation of the plurality of barrier rib parts 310 may be 5% to 10%. In more detail, the thickness deviation of the plurality of barrier rib parts 310 may be 7% to 9%.

When the thickness deviation of the plurality of barrier rib parts 310 exceeds 10%, a difference in cross-sectional area of the accommodating parts between the barrier rib parts occurs, and when the light conversion material is filled in the accommodating part, filling characteristics of the light converting material of the plurality of accommodating parts may be different due to the difference in cross-sectional area, and thus, deviation of the light conversion material may occur, thereby the optical characteristics of the optical path control member may be reduce.

Also, the plurality of barrier rib parts 310 may be formed to have a uniform width. In detail, a width deviation of the plurality of barrier rib parts 310 may be 10% or less. In detail, the width deviation of the plurality of barrier rib parts 310 may be 3% to 10%. In more detail, the width deviation of the plurality of barrier rib parts 310 may be 5% to 8%.

When the width deviation of the plurality of barrier rib parts 310 exceeds 10%, a difference in cross-sectional area of the accommodating parts between the barrier rib parts occurs, and when the light conversion material is filled in the accommodating part, filling characteristics of the light converting material of the plurality of accommodating parts may be different due to the difference in cross-sectional area, and thus, deviation of the light conversion material may occur, thereby the optical characteristics of the optical path control member may be reduce.

The light conversion material 330 including light conversion particles 330b and a dispersion liquid 330a in which the light conversion particles 330b are dispersed may be disposed in the accommodating part 320. In addition, the light conversion material may include the above-described dispersant. That is, the light conversion material may include a nonionic dispersant having an HLB of 0 to 6.

The dispersion liquid 330a may be a material that disperses the light conversion particles 330b. The dispersion liquid 330a may include a transparent material. The dispersion liquid 330a may include a non-polar solvent. In addition, the dispersion liquid 330a may include a material capable of transmitting light.

The light conversion particles 330b may be dispersed in the dispersion liquid 330a. In detail, the plurality of light conversion particles 330b may be spaced apart from each other in the dispersion liquid 330a.

The light conversion particles 330b may include a material capable of absorbing light. That is, the light conversion particles 330b may be light absorbing particles. The light conversion particles 330b may have a color. For example, the light conversion particles 330b may have a black-based color. For example, the light conversion particles 330b may include carbon black particles.

A surface of the light conversion particle 330a may be charged and may have a polarity. For example, the surface of the light conversion particle 330a may be negatively charged. Accordingly, the light conversion particles 330b may be moved toward the first electrode 210 or the second electrode 220 by applying the voltage.

The light transmittance of the accommodating part 320 may be changed by the light conversion particles 330b. In detail, the accommodating part 320 may be changed into a light blocking part and a light transmitting part by changing light transmittance by the light conversion particles 330b. That is, the accommodating part 320 may change the transmittance of light passing through the accommodating part 320 by dispersion and aggregation of the light conversion particles 330b disposed in the dispersion liquid 330a.

For example, the mode of the optical path member according to the first embodiment may be changed from the first mode to the second mode or from the second mode to the first mode by the voltage applied to the first electrode 210 and the second electrode 220.

In detail, in the optical path control member according to the embodiment, the accommodating part 320 becomes a light blocking part in the first mode, and light of a specific angle may be blocked by the accommodating part 320. That is, the viewing angle of the user looking from the outside is narrowed, so that the optical path control member may be driven in the privacy mode.

Also, in the optical path control member according to the embodiment, the accommodating part 320 becomes a light transmitting part in the second mode, and light may pass through both the barrier rib part 310 and the accommodating part 320. That is, the viewing angle of the user looking from the outside is widened, so that the optical path control member may be driven in the open mode.

The conversion from the first mode to the second mode, that is, the conversion of the accommodating part 320 from a light blocking part to a light transmitting part may be realized by the movement of the light conversion particles 330b in the accommodating part 320. That is, the surface of the light conversion particles 330b has electric charges, and when a voltage is applied, the light conversion particles 330b may move toward the first electrode or the second electrode according to the characteristics of the electric charge. That is, the light conversion particles 330b may be electrophoretic particles.

For example, when voltage is not applied to the optical path control member from the outside, the light conversion particles 330b of the accommodating part 320 are uniformly dispersed in the dispersion liquid 330a, and thus the accommodating part 320 may block light by the light conversion particles 330b. Accordingly, in the first mode, the accommodating part 320 may be driven as a light blocking part.

Also, when a voltage is applied to the optical path control member from the outside, the light conversion particles 330b may move. For example, the light conversion particles 330b may move toward one end or the other end of the accommodating part 320 by the voltage transmitted by the first electrode 210 and the second electrode 220. That is, the light conversion particles 330b may move toward the first electrode 210 or the second electrode 220.

For example, when a voltage is applied to the first electrode 210 and/or the second electrode 220, an electric field is formed between the first electrode 210 and the second electrode 220, and the negatively charged light conversion particles 330b may move in the direction of the positive electrode among the electrodes 210 and 220 using the dispersion liquid 330a as a medium.

For example, referring to FIG. 1, in an initial mode or when no voltage is applied to the first electrode 210 and/or the second electrode 220, the light conversion particles 330b may be uniformly dispersed in the dispersion liquid 330a, and the accommodating part 320 may be driven as a light blocking part.

Figure 2:
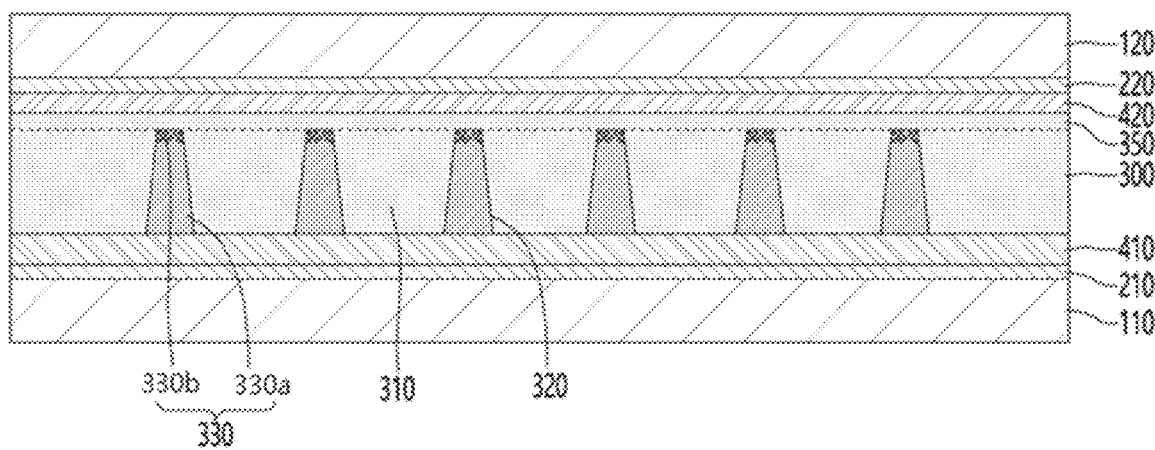

In addition, referring to FIG. 2, when a voltage is applied to the first electrode 210 and/or the second electrode 220, the light conversion particles 330*b* may move in the direction of the second electrode 220 in the dispersion liquid 330*a*. That is, the light conversion particles 330*b* may be moved in one direction, and the accommodating part 320 may be driven as a light transmitting part.

Accordingly, the optical path control member according to the embodiment may be driven in two modes according to a user's surrounding environment. That is, when the user requires light transmission only at a specific viewing angle, the accommodation part is driven as the light blocking part, or in an environment in which the user requires high brightness, a voltage may be applied to drive the accommodation part as the light transmitting part.

Therefore, since the optical path control member according to the embodiment may be implemented in two modes according to the user's requirement, the optical path control member may be applied regardless of the user's environment.

The optical path control member according to the embodiment may improve the driving speed and driving characteristics of the optical path control member by improving the moving speed of the light conversion particles.

That is, since the dispersant included in the light conversion material includes the non-polar nonionic dispersant, it is possible to inhibit formation of a bonding layer by bonding the light conversion particles and the dispersant inside the dispersion liquid.

Accordingly, when the voltage is applied to the optical path control member, since the light conversion particles may be moved directly without removing the bonding layer, the driving speed of the optical path control member may be improved.

In addition, driving characteristics of the optical path control member may be improved by improving negative charge characteristics of the barrier rib part and/or the base part.

That is, since the resin composition forming the barrier rib part and/or the base part includes the monomer having a bonding group having a high electronegativity, the barrier rib part and/or the base part may include a plurality of negative charges, and thus a polarity of the barrier rib part and/or the base part may increase.

Accordingly, it is possible to facilitate the movement of the light conversion particles by moving dispersants having positive charges inside the light conversion material in the direction of the barrier rib part and/or the base part. In addition, since the size of the negative charge of the light conversion particle may be inhibited from being reduced due to the bonding of the positively charged dispersant and the light conversion particle, the movement speed of the light conversion particle may be improved.

Accordingly, the optical path control member according to the embodiment may have improved driving speed and driving characteristics.

Hereinafter, the present invention will be described in more detail with reference to the forming of the barrier rib part and the base part according to the polarity of the resin composition formation the light conversion unit of the optical path control member according to embodiment examples and comparative examples. These embodiment examples are only presented as examples in order to explain the present invention in more detail. Therefore, the present invention is not limited to these embodiment examples.

Embodiment Example

A resin composition was formed by mixing oligomer including a urethane acrylate, a monomer, a photoinitiator, and an antistatic agent.

In this case, the monomer included a first bonding group having an electronegativity of 0.3 to 2 and a second bonding group having an electronegativity of 0 to less than 0.3, and the number of the first bonding group was greater than the number of the second bonding group.

Subsequently, after preparing a mold member including an intaglio portion and an embossed portion, the resin composition is filled in the intaglio portion of the mold member.

Subsequently, after forming a first electrode including indium tin oxide on a first substrate including polyethylene terephthalate, the first electrode and the mold member were bonded.

Subsequently, after the mold member and the resin composition were released, a base part, a barrier rib part with embossed shape, and an accommodating part with intaglio shape were formed on the substrate, and a light conversion material was filled in the accommodating part to form a light conversion unit.

At this time, the light conversion material included a nonionic dispersant.

Subsequently, after forming a second electrode including indium tin oxide on a lower portion of a second substrate including polyethylene terephthalate, the optical path control member was formed by adhering the second electrode to the light conversion unit.

Subsequently, after applying a voltage to the optical path control member, transmittance of the optical path control member was measured.

Comparative Example 1

The optical path control member was formed in the same manner as in Example 1, except that the light conversion material included an anionic dispersant.

Subsequently, after applying a voltage to the optical path control member, transmittance of the optical path control member was measured.

Comparative Example 2

The optical path control member was formed in the same manner as in Example 1, except that the light conversion material included a cationic dispersant.

Subsequently, after applying a voltage to the optical path control member, transmittance of the optical path control member was measured.

Figure 6:
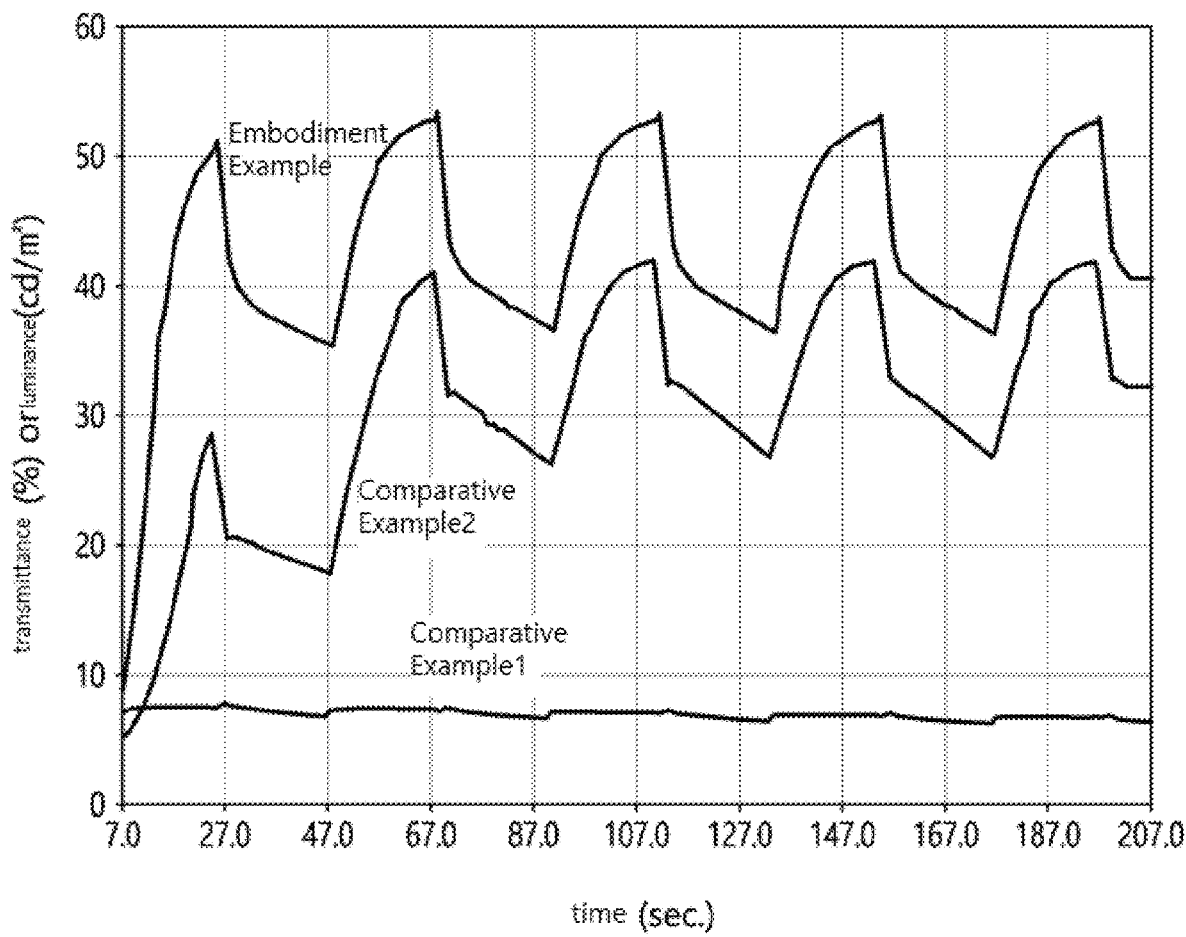
FIG. 6 is a graph for explaining the transmittance and driving speed of the optical path control member according to embodiment examples and comparison examples.

FIG. 6 is a graph showing the transmittance of optical path control members according to Embodiment Example and Comparative Example.

Referring to FIG. 6, it can be seen that the optical path control member according to the embodiment example has improved light transmittance than the optical path control member according to the comparative example.

In addition, it can be seen that the optical path control member according to the embodiment example takes a shorter time to reach the same transmittance than the optical path control member according to the comparative example. That is, it can be seen that the optical path control member according to the embodiment example has a higher driving speed than the optical path control member according to the comparative example.

That is, since the optical path control member according to the embodiment includes a light conversion material including a nonionic dispersant, it is possible to facilitate the movement of light conversion particles, and since the positively charged dispersants move in the direction of the barrier rib part or the base part, movement interference of the light conversion particles may be minimized, and thereby the optical path control member according to the embodiment may have improved driving characteristics.

Hereinafter, the optical path control member according to another embodiment will be described with reference to FIGS. 7 to 10.

Figure 7:
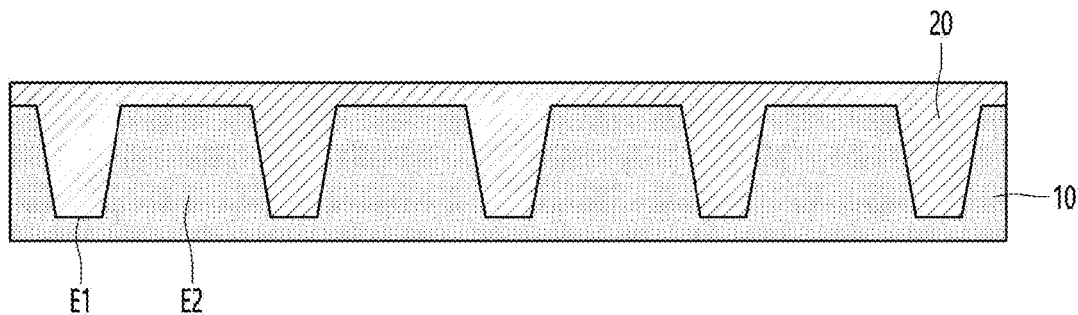
FIGS. 7 to 9 are views for explaining a manufacturing process of the light conversion unit of the optical path control member according to another embodiment.

Referring to FIG. 7, after preparing a mold member 10 including an intaglio portion E1 and an embossed portion E2, a resin composition 20 may be filled in the intaglio portion E1 of the mold member 10. The resin composition 20 may include a urethane-based resin composition.

Since the resin composition 20 is filled in the intaglio portion E1 of the mold member 10, the resin composition 20 may be disposed on the upper portion of the intaglio portion E1 and the embossed portion E2 while filling the intaglio portion E1.

Figure 8:
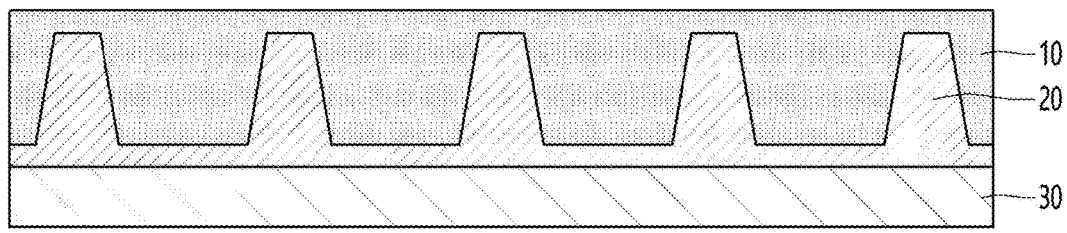

Subsequently, referring to FIG. 8, the mold member 10 filled with the resin composition 20 and the substrate 30 on which the light conversion unit is disposed may be bonded. That is, the mold member 10 and the substrate 30 may be adhered to each other by the resin composition 20 disposed on the mold member 10.

Figure 9:
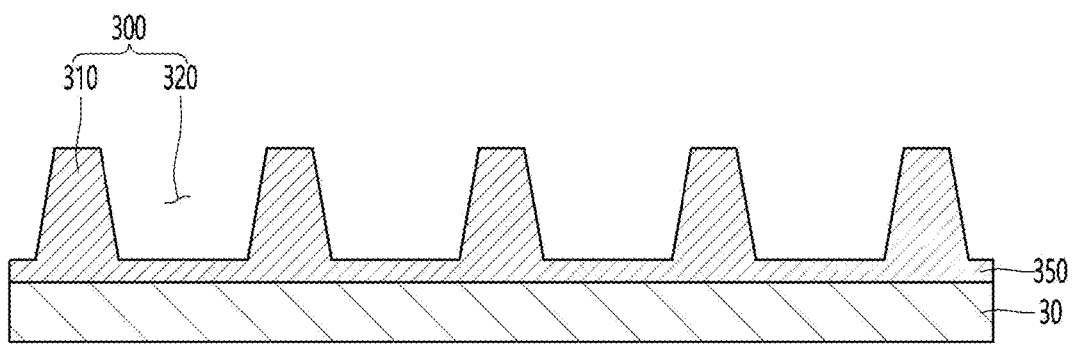

Subsequently, referring to FIG. 9, the mold member 10 is released, and thus, the light conversion unit 300 including the resin composition and including the barrier rib part 310 and the accommodating part 320 may be formed on the substrate 30.

That is, the light conversion unit 300 is formed on the substrate 30 by releasing the mold member 10, and the light conversion unit 300 may include the barrier rib part 310, the accommodating part 320 and a base part 350.

When the adhesive property of the resin composition 20 is reduced, the resin composition 20 and the substrate 30 may be entirely or partially delaminated or lifted, and thus reliability and optical properties of the optical path control member may be reduced.

The resin composition may include various additives. For example, an antistatic agent may be included for electrical properties of the resin composition. The antistatic agent may facilitate the movement of charges moving toward the accommodating part by forming a moving path for charges in the barrier rib part and the base part.

However, there is a problem in that the adhesion between the resin composition and the substrate decreases while the antistatic agent precipitates in the direction of the base.

Accordingly, the optical path control member according to the embodiment solves the above problem by controlling the properties of the material forming the light conversion unit.

The light conversion unit according to the embodiment may include the resin composition. The resin composition may include an oligomer, a monomer, and a photoinitiator. Alternatively, the resin composition may include the oligomer, the monomer, the photoinitiator, and an additive. The resin composition may constitute the light conversion unit by a reaction between a prepolymer in the form of a polymer, a multifunctional monomer as a diluent, and a photoinitiator.

Figure 10:
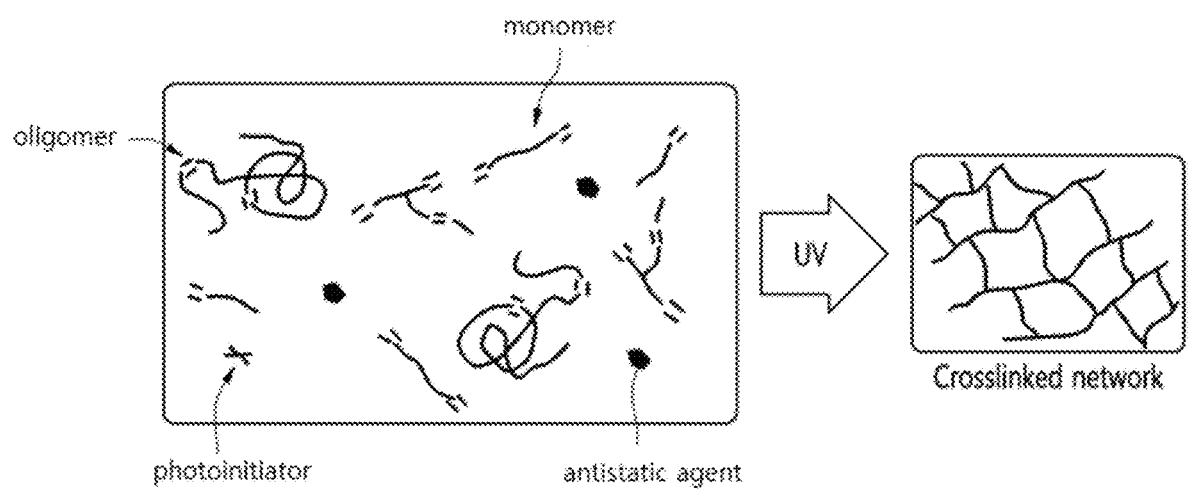
FIG. 10 is view for explaining a curing process of a resin composition of the light conversion unit according to another embodiment.

That is, referring to FIG. 10, the resin composition includes the oligomer, the monomer, the photoinitiator, and the additive before curing, and the resin composition may be cured by ultraviolet light while forming a network of cross-linking structure by the reaction of the polymer, the monomer, and the photoinitiator.

The resin composition may include a urethane acrylate polymer. For example, the oligomer may include urethane acrylate.

The oligomer may include an oligomer having a pi bond. The oligomer may include an oligomer including an aromatic ring. For example, the oligomer may include an oligomer including a benzene ring. In detail, the oligomer may include an oligomer having at least two benzene rings.

For example, the oligomer may include oligomers such as amine modified polyether acrylate and aliphatic urethane acrylates.

The pi bond is a structure in which electrons are distributed below and above the axis between nuclei, and can facilitate the movement of charges.

Accordingly, the resin composition may not include a separate additive that facilitates charge transfer. That is, the resin composition does not include an additive such as an antistatic agent. Accordingly, it is possible to inhibit the light conversion unit formed of the resin composition from being delaminated or lifted by the antistatic agent.

In addition, since the oligomer is cross-linked by the monomer and the photoinitiator, precipitation of the oligomer may not occur.

Accordingly, the optical path control member including the light conversion unit formed of the resin composition according to the embodiment may have improved reliability and optical characteristics.

The oligomer may include oligomers having different bonds. In detail, the oligomer may include a first oligomer and a second oligomer having different bonds.

For example, the oligomer may include the first oligomer having a pi bond and the second oligomer having a sigma bond. In detail, the oligomer may include the first oligomer including an aromatic ring and the second oligomer not including the aromatic ring. In detail, the oligomer may include the first oligomer including a benzene ring and the second oligomer not including the benzene ring.

The second oligomer having the sigma bond may have a structure in which electron density is concentrated between nuclei along a linear axis between nuclei.

For example, the second oligomer may include oligomers such as aromatic urethane acrylates and epoxy acrylates.

As described above, the first oligomer may serve to facilitate the movement of charges in the light conversion unit formed by the resin composition.

The second oligomer may serve to improve transmittance of the light conversion unit formed of the resin composition.

The first oligomer and the second oligomer may be included in different weight % ratios that are the same or different from each other.

In detail, the first oligomer may be included in an amount of 20 wt % to 99 wt % based on the total weight of the oligomer. In addition, the second oligomer may be included in an amount of 1 wt % to 80 wt % based on the total weight of the oligomer.

When the amount of the first oligomer is less than 20 wt % based on the total amount of the oligomer, charge transfer characteristics of the light conversion unit may be reduced. Also, when the first oligomer is included in an amount of more than 99 wt % based on the total weight of the oligomer, the light transmittance of the light conversion unit may decrease.

When the first oligomer and the second oligomer satisfy the above range, since the antistatic agent is not required in the optical path control member formed by the resin composition including the oligomers, the luminance of the optical path control member in the open mode may be improved.

Alternatively, the first oligomer may be included in an amount of 1 wt % to 20 wt % based on the total weight of the oligomer. In addition, the second oligomer may be included in an amount of 80% to 99% by weight based on the total weight of the oligomer.

Accordingly, when the first oligomer and the second oligomer satisfy the above range, the light shielding rate in the privacy mode of the optical path control member formed of the resin composition including the oligomers may be improved.

As the photoinitiator, a known photoinitiator for UV curing may be applied. In addition, the additive may include a material for improving releasability or electrical properties of the resin composition. For example, the additives may include various materials including release additives and antistatic agents.

Also, the monomer may include at least one monomer. In detail, the monomer may include a single monomer or a plurality of monomers. The viscosity of the resin composition is changed by mixing the monomers, and release characteristics of the resin composition and the substrate may be improved.

The oligomer, the monomers, the photoinitiator, and the additive included in the resin composition may be included in different weight %.

In detail, the oligomer may be included in an amount of 40 wt % to 60 wt % based on the total weight of the resin composition.

In addition, the monomer may be included in an amount of 30 wt % to 40 wt % based on the total weight of the resin composition.

In addition, the photoinitiator may be included in an amount of 0.1 wt % to 5 wt % based on the total weight of the resin composition.

Hereinafter, the present invention will be described in more detail with reference to the light transmittance according to the oligomer of the resin composition formation the light conversion unit of the optical path control member according to embodiment examples and comparative examples. These embodiment examples are only presented as examples in order to explain the present invention in more detail. Therefore, the present invention is not limited to these embodiment examples Embodiment Example 1

A resin composition was formed by mixing oligomer including a urethane acrylate, a monomer, and a photoinitiator.

At this time, the oligomer included at least one pi bond.

Subsequently, after preparing a mold member including a intaglio portion and a embossed portion, the resin composition is filled in the intaglio portion of the mold member.

Subsequently, after forming a first electrode including indium tin oxide on a first substrate including polyethylene terephthalate, the first electrode and the mold member were bonded.

Subsequently, after the mold member and the resin composition were released, a base part, a barrier rib part with embossed shape, and an accommodating part with intaglio shape were formed on the substrate, and a light conversion material was filled in the accommodating part to form a light conversion unit.

Subsequently, after forming a second electrode including indium tin oxide on a lower portion of a second substrate including polyethylene terephthalate, the optical path control member was formed by adhering the second electrode to the light conversion unit.

Subsequently, light was transmitted from the first substrate toward the second substrate, and the left and right 45° light transmittance according to the application of voltage was measured.

Embodiment Example 2

The optical path control member was formed in the same manner as in Embodiment Example 1, except that 80% of oligomers having pi bonds and 20% of oligomers having sigma bonds were included.

Subsequently, light was transmitted from the first substrate toward the second substrate, and the left and right 45° light transmittance according to the application of voltage was measured.

Embodiment Example 3

The optical path control member was formed in the same manner as in Embodiment Example 1, except that 20% of oligomers having pi bonds and 80% of oligomers having sigma bonds were included.

Subsequently, light was transmitted from the first substrate toward the second substrate, and the left and right 45° light transmittance according to the application of voltage was measured.

Comparative Example 3

The optical path control member was formed in the same manner as in Example 1, except that the oligomer included sigma bonds rather than pi bonds.

Subsequently, light was transmitted from the first substrate toward the second substrate, and the left and right 45° light transmittance according to the application of voltage was measured.

TABLE 1

| | Light transmittance in undriven (%) | Light transmittance after voltage application (%) |
|---|---|---|
| Embodiment Example 1 | 6~9 | 40~43 |
| Comparative Example 3 | 2~3 | 10~21 |

TABLE 2

| | Light transmittance in undriven (%) | Light transmittance after voltage application (%) |
|---|---|---|
| Embodiment Example 1 | 6~9 | 40~43 |
| Embodiment Example 2 | 5~6 | 38~40 |
| Embodiment Example 3 | 4~5 | 35~38 |

TABLE 3

| sigma-vonded oligomer | pi-bonded oligomer | Light transmittance after voltage application (%) |
|---|---|---|
| 0 | 100 wt % | 200% |
| 20 wt % | 80 wt % | 190% |

TABLE 3-continued

| sigma-vonded oligomer | pi-bonded oligomer | Light transmittance after voltage application (%) |
|---|---|---|
| 80 wt % | 20 wt % | 179% |
| 100 wt % | 0 | 100% |

Referring to Table 1, it can be seen that the light transmittance of the optical path control member according to Example 1 is increased when a voltage is applied. That is, it can be seen that the light transmittance is increased when the optical path control member is driven in the open mode by applying a voltage.

Accordingly, it can be seen that the optical path control member according to Example 1 may improve the driving characteristics and luminance of the optical path control member by facilitating the movement of charges by the oligomer of the resin composition without using a separate additive.

Also, referring to Table 2, it can be seen that the light transmittance of the optical path control members according to Examples 2 and 3 is reduced in an undriven state in which voltage is not applied.

Accordingly, it can be seen that the shielding effect can be improved by reducing the light transmittance in the privacy mode of the optical path control member.

In addition, referring to Table 3, as the optical path control member according to the embodiment includes an oligomer having the pi bond, the transmittance of the optical path control member is relatively increased compared to the resin composition containing only the oligomer having the sigma bond.

Hereinafter, referring to FIGS. 11 to 15, a display device to which an optical path control member according to an embodiment is applied will be described.

Figure 11:
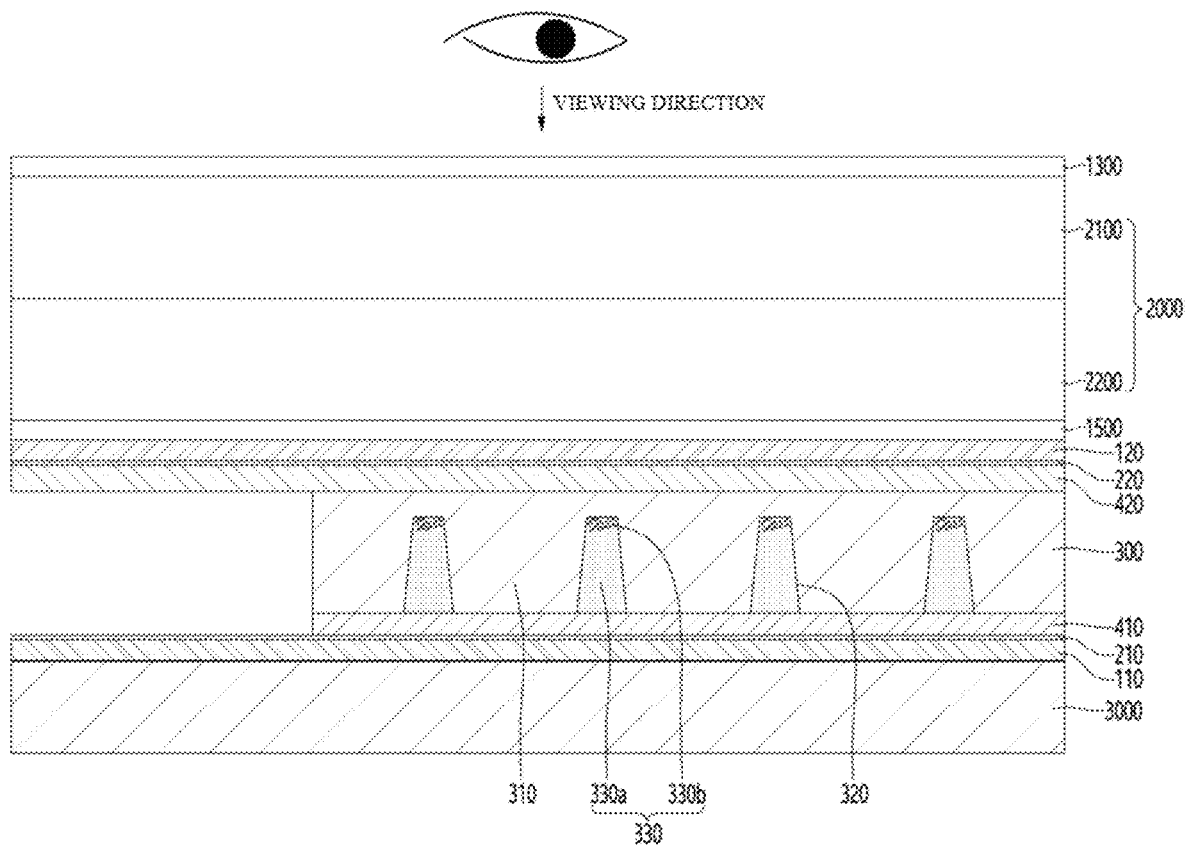
FIGS. 11 and 12 are cross-sectional views of a display device to which an optical path control member according to the embodiment is applied.
Figure 12:
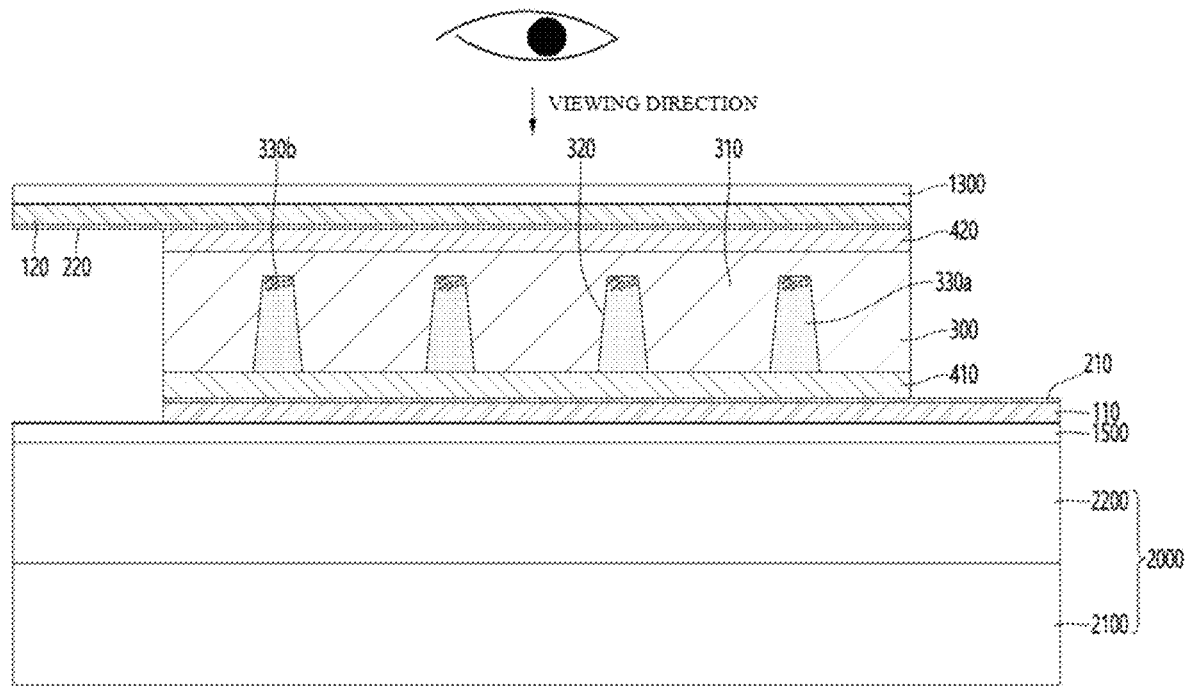

Referring to FIGS. 11 and 12, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 11, the optical path control member may be disposed under the liquid crystal panel and on the backlight unit 3000, and the optical path control member may be disposed between the backlight unit 3000 and the display panel 2000.

Alternatively, as shown in FIG. 12, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is illustrated in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the optical conversion unit of the optical path control member according to the embodiment is in a direction parallel or perpendicular to an outer surface of the second substrate, but the optical conversion unit is formed to be inclined at a predetermined angle from the outer surface of the second substrate. Through this, a moire phenomenon occurring between the display panel and the optical path control member may be reduced.

Figure 15:
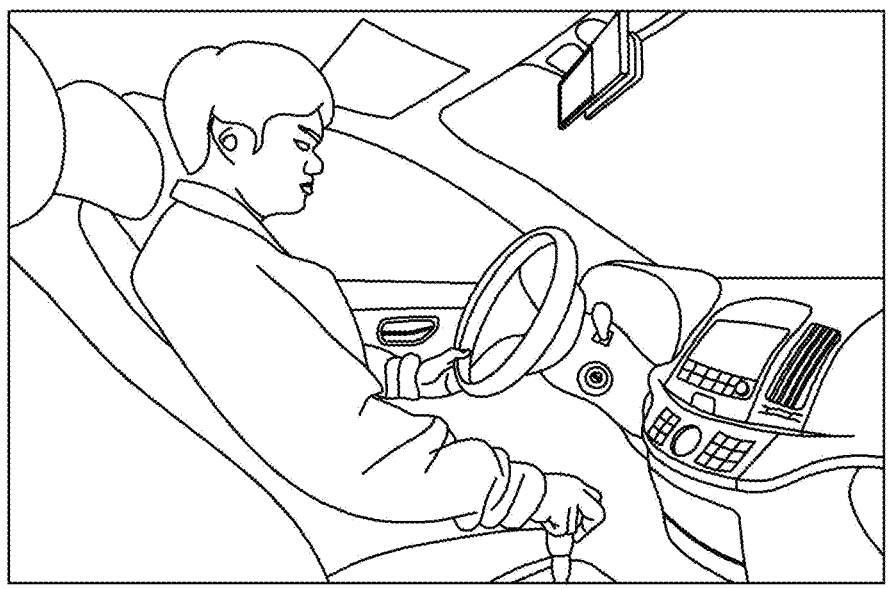

Referring to FIGS. 13 to 15, an optical path control member according to an embodiment may be applied to various display devices.

Referring to FIGS. 13 to 15, the optical path control member according to the embodiment may be applied to a display device that displays a display.

For example, when power is applied to the optical path control member as shown in FIG. 13, the accommodating part functions as the light transmitting part, so that the display device may be driven in the public mode, and when power is not applied to the optical path control member as shown in FIG. 14, the accommodating part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 15, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
a first substrate;
a first electrode disposed on the first substrate;
a second substrate disposed on the first substrate;
a second electrode disposed under the second substrate; and
a light conversion unit disposed between the first electrode and the second electrode,
wherein the light conversion unit includes a barrier rib part, an accommodating part, and a base part,
wherein a light conversion material including a dispersion liquid, light conversion particles, and a dispersant is disposed in the accommodating part,
wherein the dispersant includes a first dispersant, a second dispersant, a third dispersant, and a fourth dispersant,
wherein the first dispersant and the second dispersant are non-polar dispersants,
wherein the third dispersant and the fourth dispersant are polar dispersants,
wherein the second dispersant is formed by aggregating the first dispersants,
wherein the third dispersant is formed by the first dispersant losing electrons,
wherein the fourth dispersant is formed by bonding the second dispersant and the third dispersant.

2. The optical path control member of claim 1, wherein Hydrophile-Lipophile Balance (HLB) of the dispersant is 0 to 6.

3. The optical path control member of claim 1, wherein the barrier rib part and the base part include a resin composition,
wherein the resin composition includes an oligomer, a monomer, a photoinitiator, and an additive,
wherein the monomer includes a first bonding group and a second bonding group,
wherein an electronegativity of the first bonding group is 0.3 to 2,
wherein an electronegativity of the second bonding group is 0 to 0.3,
wherein the first bonding group is greater than the second bonding group.

4. The optical path control member of claim 3, wherein a contact angle between the resin composition and water is 10° to 60°.

5. The optical path control member of claim 3, wherein the monomer includes at least one bonding group of C—O, C—S, C—N, O—H, N—H, C—Cl, C—Br, C—I, and Si—O—Si.

6. The optical path control member of claim 3, wherein the second bonding group includes at least one non-polar bonding group of C—C, C=O, and C—H.

7. A display device comprising:
a panel including at least one of a display panel and a touch panel; and
the optical path control member of claim 1, which is disposed on or under the panel.

8. The display device of claim 7, wherein the panel includes a backlight unit and a liquid crystal display panel,
wherein the optical path control member is disposed between the backlight unit and the liquid crystal display panel, and wherein a light emitted from the backlight unit moves in a direction of the second substrate from the first substrate.

9. The optical path control member of claim 1, wherein the second dispersant and the third dispersant are formed in a micelle shape.

10. The optical path control member of claim 9, wherein the barrier rib part, the base part, and the light conversion particles include negative charges,
wherein the third dispersant and the fourth dispersant include a positive charge.

11. The optical path control member of claim 10, wherein the first oligomer is included in an amount of 10 wt % to 90 wt % based on the total weight of the oligomer.

12. The optical path control member of claim 1, wherein the third dispersant and the fourth dispersant have polarities opposite to those of the light conversion particles.

13. The optical path control member of claim 1, wherein the first to fourth dispersants are disposed between the light conversion particles.

14. The optical path control member of claim 13, wherein the oligomer includes at least one aromatic ring.

15. The optical path control member of claim 13, wherein the oligomer includes at least one benzene ring.

16. The optical path control member of claim 13, wherein the oligomer includes a first oligomer having a pi bond and a second oligomer having a sigma bond.

17. The optical path control member of claim 1, wherein at least one of the barrier rib part and the base part has a polarity.

18. The optical path control member of claim 17, wherein at least one of the barrier rib part and the base part has a polarity opposite to that of the third dispersant and the fourth dispersant.

19. The optical path control member of claim 1, wherein the light conversion unit includes a resin composition,
wherein the resin composition includes an oligomer, a monomer, and a photoinitiator,
wherein the oligomer includes an oligomer having a pi bond.

* * * * *